United States Patent [19]
Montegari

[11] Patent Number: 5,172,010
[45] Date of Patent: Dec. 15, 1992

[54] CLOCK CHOPPER/STRETCHER FOR HIGH END MACHINES

[75] Inventor: Frank A. Montegari, Wappingers Falls, N.Y.

[73] Assignee: International Business Machines Corp.

[21] Appl. No.: 712,270

[22] Filed: Jun. 7, 1991

[51] Int. Cl.⁵ .................. H03K 3/017; H03K 5/13
[52] U.S. Cl. .................. 307/265; 307/240; 307/269; 328/58
[58] Field of Search ............ 307/240, 265, 268, 247.1, 307/455, 269, 480; 328/58

[56] References Cited

U.S. PATENT DOCUMENTS

| | | |
|---|---|---|
| 3,150,324 | 9/1964 | Hallden et al. |
| 3,594,733 | 7/1971 | Lukens ................ 328/110 |
| 3,831,098 | 8/1974 | Fletcher ............... 328/58 |
| 3,840,815 | 10/1974 | Masters ............... 328/58 |
| 4,851,711 | 7/1989 | Chan et al. .......... 307/288 |

OTHER PUBLICATIONS

Clock Chopper for Complementary-Transistor Switch Arrays; IBM Tech. Disc. Bulletin, vol. 29, No. 7, Dec. 1986, pp. 3148–3151.
Redundant Clock Chopper; IBM Tech. Disclosure Bulletin, vol. 31, No. 9, Feb. 1989, pp. 310–311.
Redundant Clock Shopper with Clock-Chopper Inhibit; IBM Tech. Disc. Bulletin, vol. 32, No. 7, Dec. 1989, pp. 120–121.
Clock Chopper On-Chip Delay and Pulse-Width Measurement Technique; IBM Tech. Disc. Bulletin, vol. 32, No. 8a, Jan. 1990, pp. 136–139.

Primary Examiner—Timothy P. Callahan

[57] ABSTRACT

A chopper/stretcher circuit provides on-chip clock distribution with minimum insertion delay. The on-chip clock chopper/stretcher circuit triggers only on the transition of an off-chip generated clock input and determines the generated pulse width of the clock by means of an on-chip delay line. The circuit introduces only one stage of delay in the clock path.

7 Claims, 6 Drawing Sheets

CLOCK CHOPPER/STRETCHER FOR HIGH END MACHINES

BACKGROUND OF THE INVENTION

1. Field of the Invention

The present invention generally relates to the distribution of clock signals to digital circuits on integrated circuit (IC) chips and, more particularly, to a clock chopper/stretcher circuit for receiving a system clock from off-chip and distributing a clock pulse to the on-chip circuits that require clocking while adding minimal insertion delay. The invention has particular application in high performance, or high-end, computing machines and especially in memory circuits for such machines.

2. Description of the Prior Art

On-chip clock distribution circuits for high-performance or high-end computing machines must be able to tailor an incoming clock pulse by both chopping (reduce the width) and stretching (extend the width) of a system generated clock pulse to obtain the desired pulse width. This is necessary because only the start of the system clock pulse is controlled and the end is unpredictable or has a very large tolerance. But the clock distribution circuits must also introduce a minimum of clock delay to provide early gating of address and data. In addition, the clock distribution circuits must respond only to input transitions and not levels in order to provide testing flexibility.

Prior art chopper/stretcher designs use logic macros that are cross-coupled to form a complex latch that adds an undesirable large insertion delay in the clock path. While these designs accomplish the twin requirements of chopping and stretching a system generated clock pulse to obtain the desired pulse width, they are generally unsuitable for high-end machines because they introduce excessive clock delay.

Also known in the prior art are U.S. Pat. No. 4,851,711 to Chan et al. and a related *IBM Technical Disclosure Bulletin*, vol. 29, no. 7, Dec. 1986, pp. 3148-3151, by Chan entitled "Clock Chopper for Complementary-Transistor Switch Arrays". The disclosed circuits chop a clock pulse, making it shorter than the system supplied pulse; however, these circuits do not stretch the clock pulse if it is already too short. This means that the system clock must be longer (i.e., wider) than the pulse required by the clocked circuits.

U.S. Pat. No. 3,831,098 to Fletcher et al. discloses a pulse stretcher specifically for stretching short pulses of several nanoseconds width to wider pulses of typically one microsecond for further processing by commercial pulse height analyzers. This pulse stretcher is not adaptable to high speed memory applications, mainly because it introduces a very large delay which is acceptable for its specialized application. It is not a clock chopper.

U.S. Pat. No. 3,594,733 to Lukens II discloses a pulse stretcher designed for very low speed recirculating memory applications. Its purpose is to synchronize two pulses. It is not a clock chopper and would introduce a large clock delay in any practical implementation.

U.S. Pat. No. 3,150,324 to Hallden et al. describes a recirculating loop delay line that operates at very low speeds (e.g., ultrasonic) for data accumulation systems. This Hallden et al. circuit is neither a stretcher or a chopper.

*IBM Technical Disclosure Bulletin*, vol. 31, no. 9, Feb. 1989, pp. 310-311, by Knebel et al. entitled "Redundant Clock Chopper", describes a redundancy scheme to avoid chip failure if one clock chopper circuit fails or has manufacturing faults. This circuit only chops a clock pulse. It cannot stretch a pulse if the system clock is too short.

*IBM Technical Disclosure Bulletin*, vol. 32, no. 7, Dec. 1989, pp. 120-121, by Budell entitled "Redundant Clock Chopper with Clock-Chopper Inhibit", describes a clock chopper that is similar to the circuit disclosed by Knebel et al., supra. This circuit also chops but does not stretch.

*IBM Technical Disclosure Bulletin*, vol. 32, no. 8A, Jan. 1990, pp. 136-139, by Gupte et al. entitled "Clock Chopper On-Chip Delay and Pulse-Width Measurement Technique", describes a method of accurately measuring the width of a chopped clock by using the on-chip McLeod technique. The chopper circuit is not described and there is no mention of pulse stretching.

Thus, there remains to be solved the difficult problem of both stretching a system supplied clock that is too short (i.e., narrow) for the circuits that it must drive and to also chop the same clock if it is too long (i.e., wide) for those same circuits. Moreover, in high-end machines it is desirable to accomplish these functions without introducing a large circuit delay in the clock network.

SUMMARY OF THE INVENTION

It is therefore an object of the present invention to provide an improved chopper/stretcher circuit for on-chip clock distribution with minimum insertion delay.

It is another object of the invention to provide an on-chip clock chopper/stretcher circuit which triggers only on the transition of an off-chip generated clock input and determines the generated pulse width of the clock on-chip.

According to the invention, there is provided a clock chopper/stretcher circuit which includes a receiver and a delay circuit that chops the off-chip generated clock pulse. The receiver is triggered only on the transition of the clock input and ignores d.c. levels and input clock pulse width. The receiver sets a latch and also drives an emitter follower driver that provides the clock driver output to the on-chip circuits. The combination of the receiver and the emitter follower driver introduces only one stage of delay in the clock path. The width of the clock is determined by an on-chip delay line which is connected between the clock driver output and a reset circuit for the latch.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
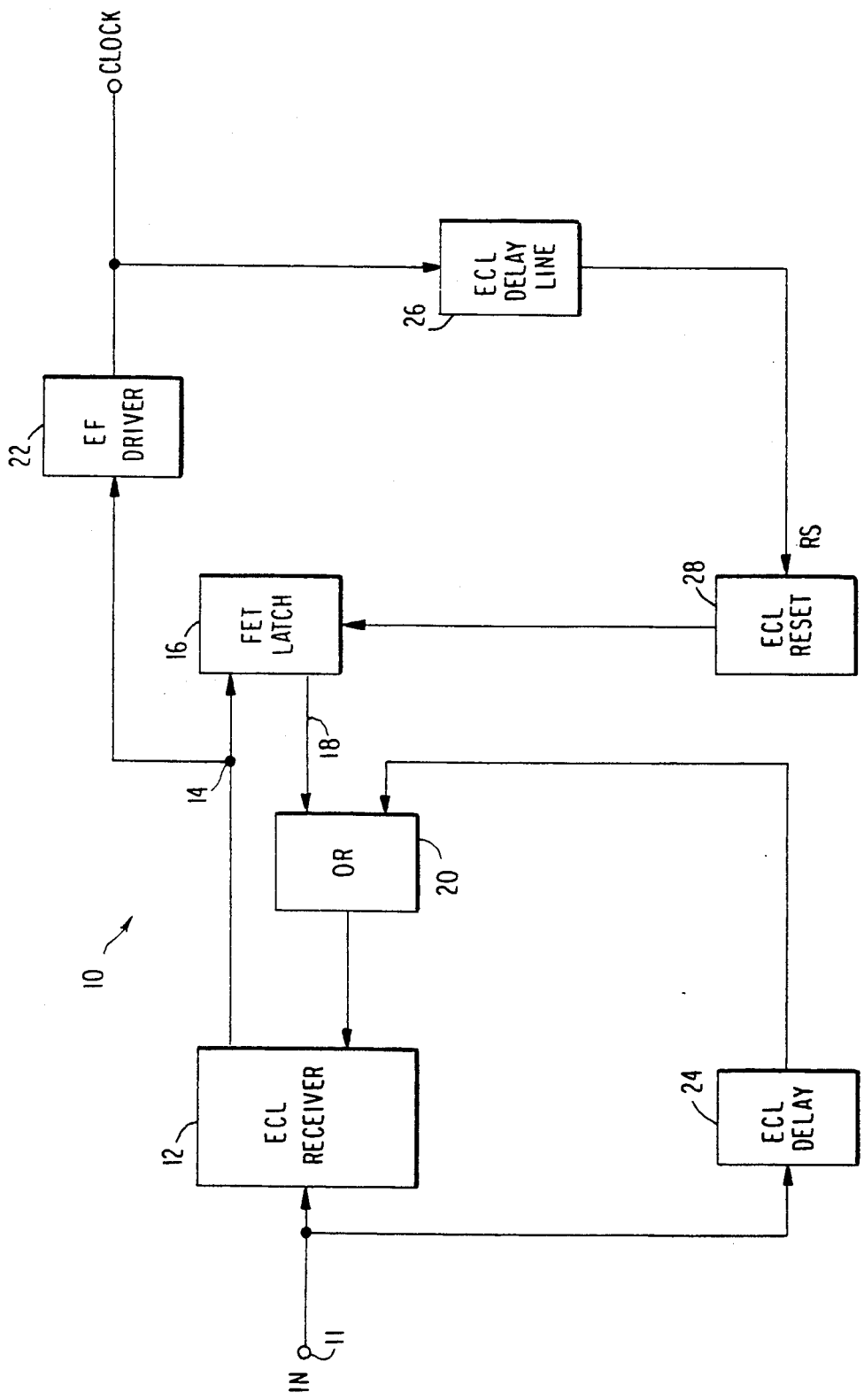
FIG. 1 is a block diagram of the clock chopper/stretcher circuit illustrating the overall operation of the invention.

Referring now to the drawings, and more particularly to FIG. 1, there is shown a block diagram of the clock chopper/stretcher circuit 10 according to the invention. The circuitry represented by the block diagram is implemented on and integrated circuit (IC) chip. Its purpose is to receive a system clock from off-chip and distribute a negative clock pulse to the on-chip circuits that require clocking.

In FIG. 1, an off-chip generated clock is applied to IN terminal 11 which is connected to an emitter coupled logic (ECL) receiver 12. The ECL receiver 12 is triggered on the transition of the clock input. An up level clock input applied to terminal 11 is translated by the ECL receiver 12 to pull node 14 down. This, in turn, causes the metal oxide semiconductor field effect transistor (MOSFET, hereinafter FET) latch 16 to switch state and hold node 14 down. The output of FET latch 16 is fed back via node 18 and OR gate 20 to disable ECL receiver 12.

Chopping of the input clock is accomplished by the combination of the ECL receiver 12 and an ECL delay circuit 23. More specifically, the off-chip clock applied at terminal 11 is also applied to the ECL delay circuit 24 which applies the clock via OR gate 20 to the ECL receiver 12. This allows latch 16 to be reset without interference from the input and results in complete independence from the clock pulse applied to input terminal 11 after a rising transition is detected.

Node 14 is also directly connected to the emitter follower clock driver 22 that which drives the circuits on the chip that require a clock. The width of the clock pulse is determined by an ECL delay line 26 connected to the output of emitter follower 22. The delay line 26 returns a reset pulse to an ECL reset circuit 28 which resets the FET latch 14. Thus, the input pulse width is determined solely by the delay line 26 and not the input pulse width.

Figure 2:
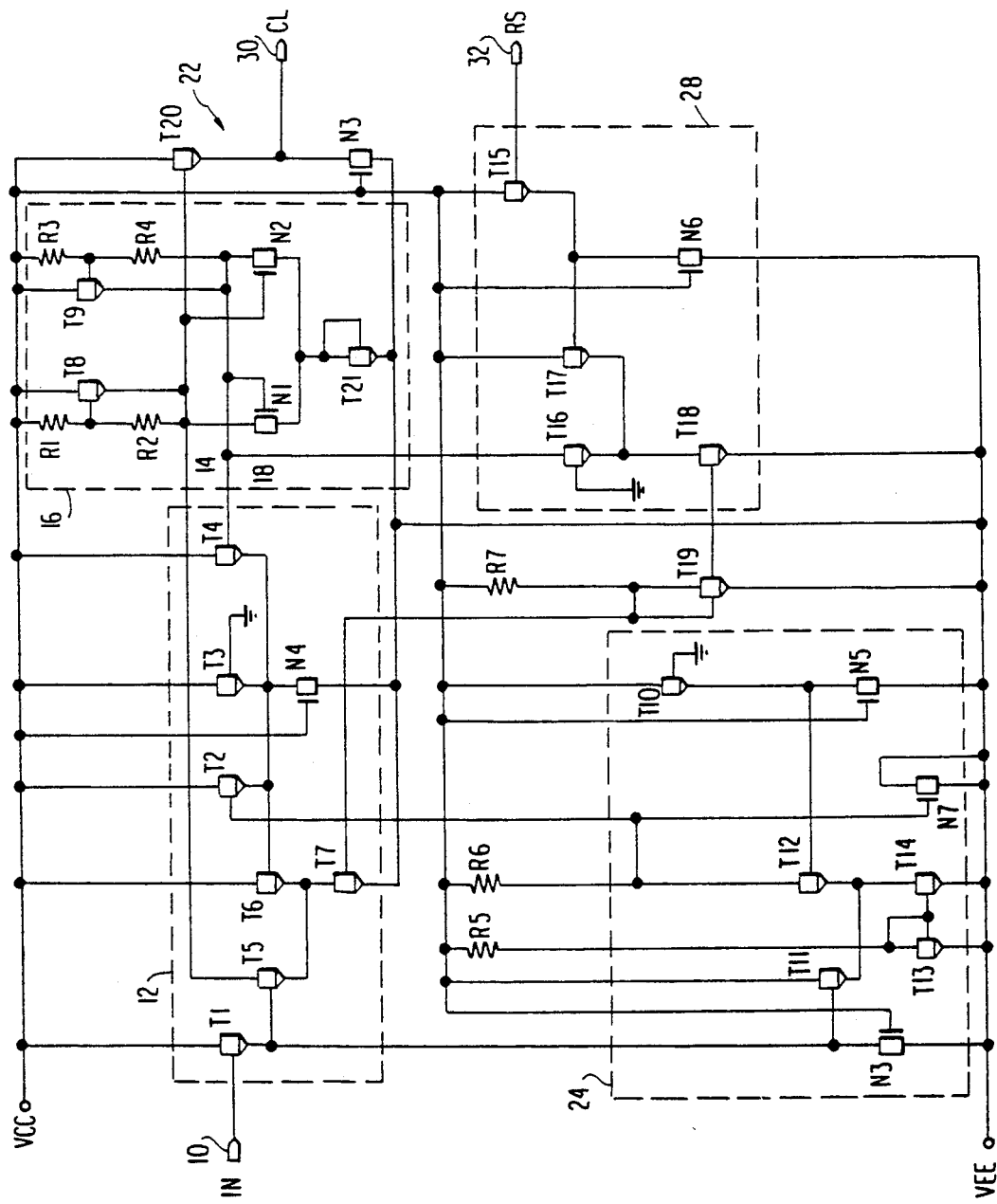
FIG. 2 is a schematic circuit diagram of the clock chopper/stretcher circuit according to a preferred embodiment of the invention.

A specific implementation of the circuit according to the invention is shown in FIG. 2. The received clock pulse at input terminal 11 is first chopped in the ECL receiver circuit 12 comprising NPN bipolar transistors $T_1$ to $T_7$. Transistors $T_2$ and $T_4$ are off and the ground level at the base of transistor $T_3$ is translated through transistor $T_3$ into $-0.9$ volts at the base of transistor $T_6$. An up level clock input applied to input terminal 11 is translated through transistor $T_1$ into $-0.4$ volts at the base of transistor $T_5$, turning transistor $T_5$ on, which pulls node 14 down.

When node 14 pulls down, the cross-coupled FET latch 16, comprising N-channel FETs $N_1$ and $N_2$, NPN bipolar transistor $T_{21}$ and load resistors $R_1$, $R_2$, $R_3$, and $R_4$, clamped by NPN bipolar transistors $T_8$ and $T_9$, switches to a state that latches node 14 at a down level. With node 14 down, node 18, on the opposite side of the latch goes to $V_{cc}$ and feeds the base of transistor $T_4$, which constitutes one input of the OR gate 20 shown in FIG. 1. Transistor $T_4$ pulls the base of transistor $T_6$ up higher than the base of transistor $T_5$, thus turning transistor $T_5$ off, even if a $+0.5$ volt up level is still present in clock input terminal 11. Since the collector of transistor $T_6$ is connected to $V_{cc}$, its high base voltage cannot cause saturation. Node 14 also connects directly to the base of NPN bipolar emitter follower clock driver transistor $T_{20}$ which drives the on-chip circuits that require a clock via clock node 30, thus providing a clock with only one ECL stage of delay.

Emitter dot transistor $T_2$ constitutes the other input to the OR gate 20 shown in FIG. 1 and is fed by the delayed cutoff ECL circuit 24 including NPN bipolar transistors $T_{10}$ to $T_{14}$ to maintain transistor $T_5$ in an off state as long as an up level is present at clock input terminal 11. Some time after latch 16 is set, the cutoff circuit 24 takes control, and transistor $T_5$ no longer has to rely upon transistor $T_4$ to maintain its off state. This allows latch 16 to be reset without interference from the input clock signal and results in complete independence from the input clock signal after a rising transition is detected. Delayed cutoff circuit 24 receives its input from emitter follower transistor $T_1$ and supplies an in-phase output that is delayed by N-channel FET $N_7$ whose source and drain are both connected to $V_{EE}$ and acts as a large capacitor to slow the transition at the collector node of transistor $T_{12}$ which feeds the bas of transistor $T_2$. The delayed cutoff of approximately 200 picoseconds (ps) is added to guarantee setting of the latch 16 before transistor $T_5$ is forced off.

Figure 2A:
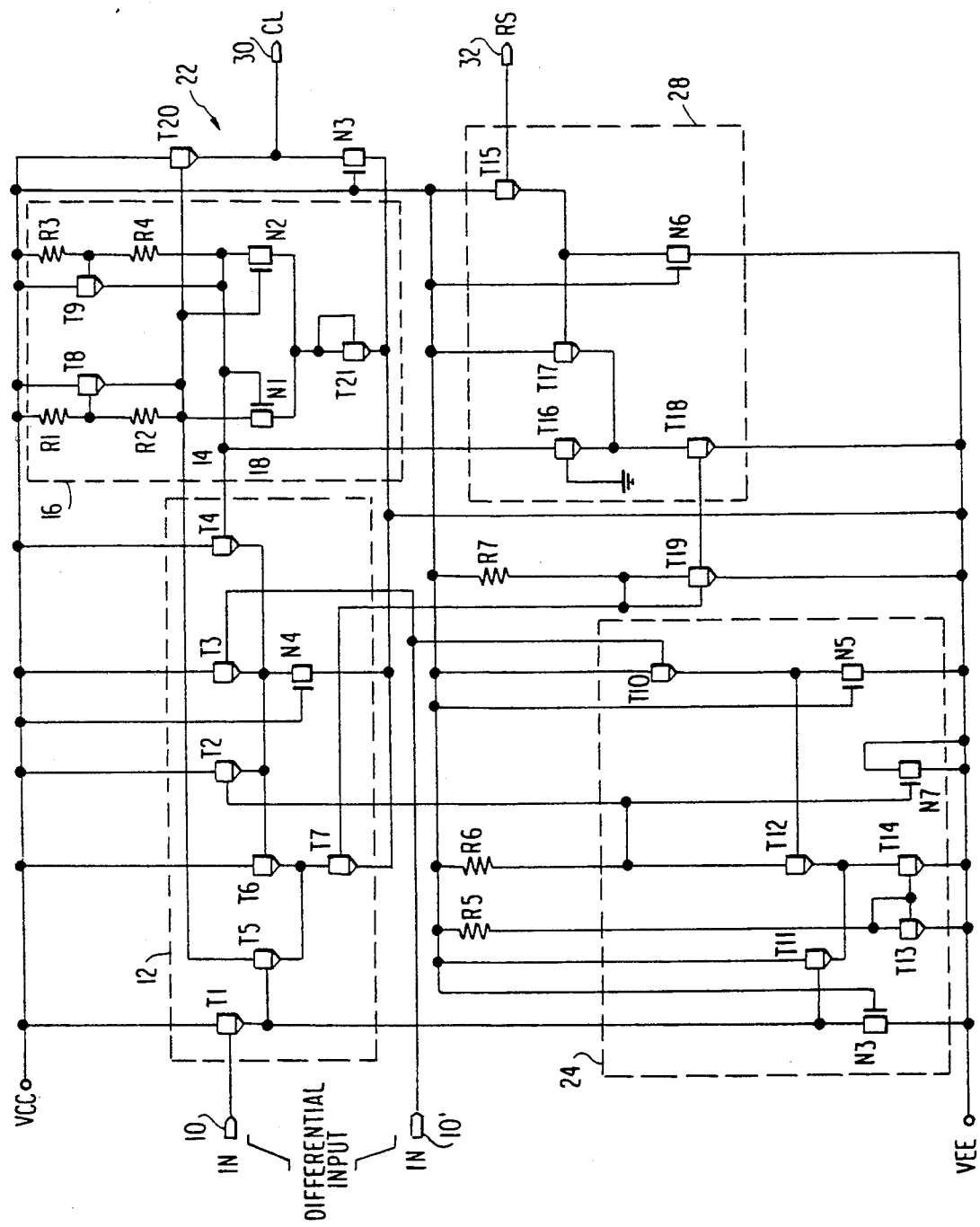
FIG. 2A is a schematic circuit diagram showing an alternative differential input to the circuit.

FIG. 2A shows a modification to the circuit shown in FIG. 2 to accept a differential input. In FIG. 2A, the bases of NPN transistors $T_3$ and $T_{10}$ are removed from circuit ground connected together and to input terminal 10'. The input terminals 10 and 10' constitute the differential input to the circuit with input terminal 10, receiving the out-of-phase clock input. In a further alternative circuit arrangement, the FET latch 16 may be replaced by a bipolar latch, but this would be at the expense of several more bipolar devices.

Figure 3:
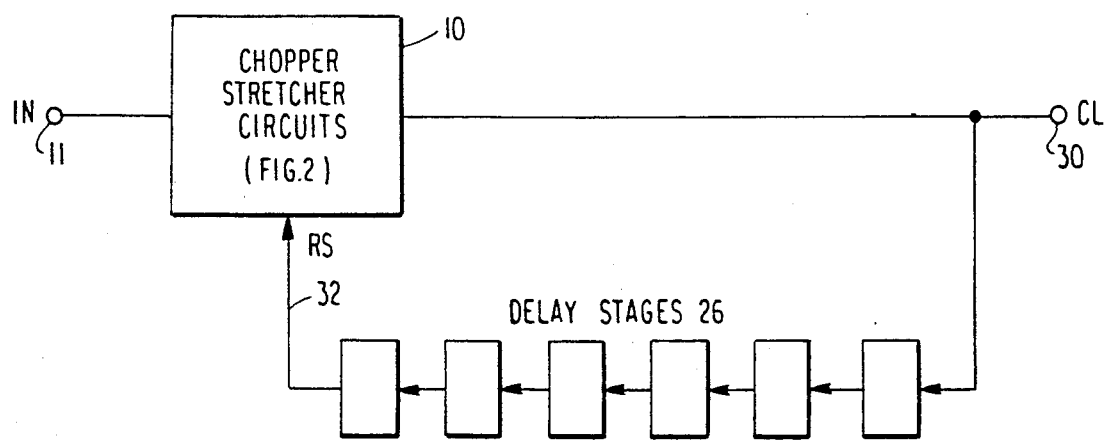
FIG. 3 is a block diagram of an on-chip clock system employing a programmable delay line.

The width of the clock pulse is determined by the delay line 26, shown in the block diagram of FIG. 3, that may be electronically programmed in some designs. The delay line, usually made up of cascaded circuits, is fed from the clock output at the emitter of transistor $T_{20}$ and returns a reset pulse to an ECL reset circuit 28 comprising NPN transistors $T_{15}$ to $T_{18}$. When a negative pulse appears at reset node 32, transistor $T_{15}$ translates it down and feeds the base of transistor $T_{17}$ which turns off and allows transistor $T_{16}$ to turn on, pulling node 18 down and resetting the latch 16.

Figure 4:
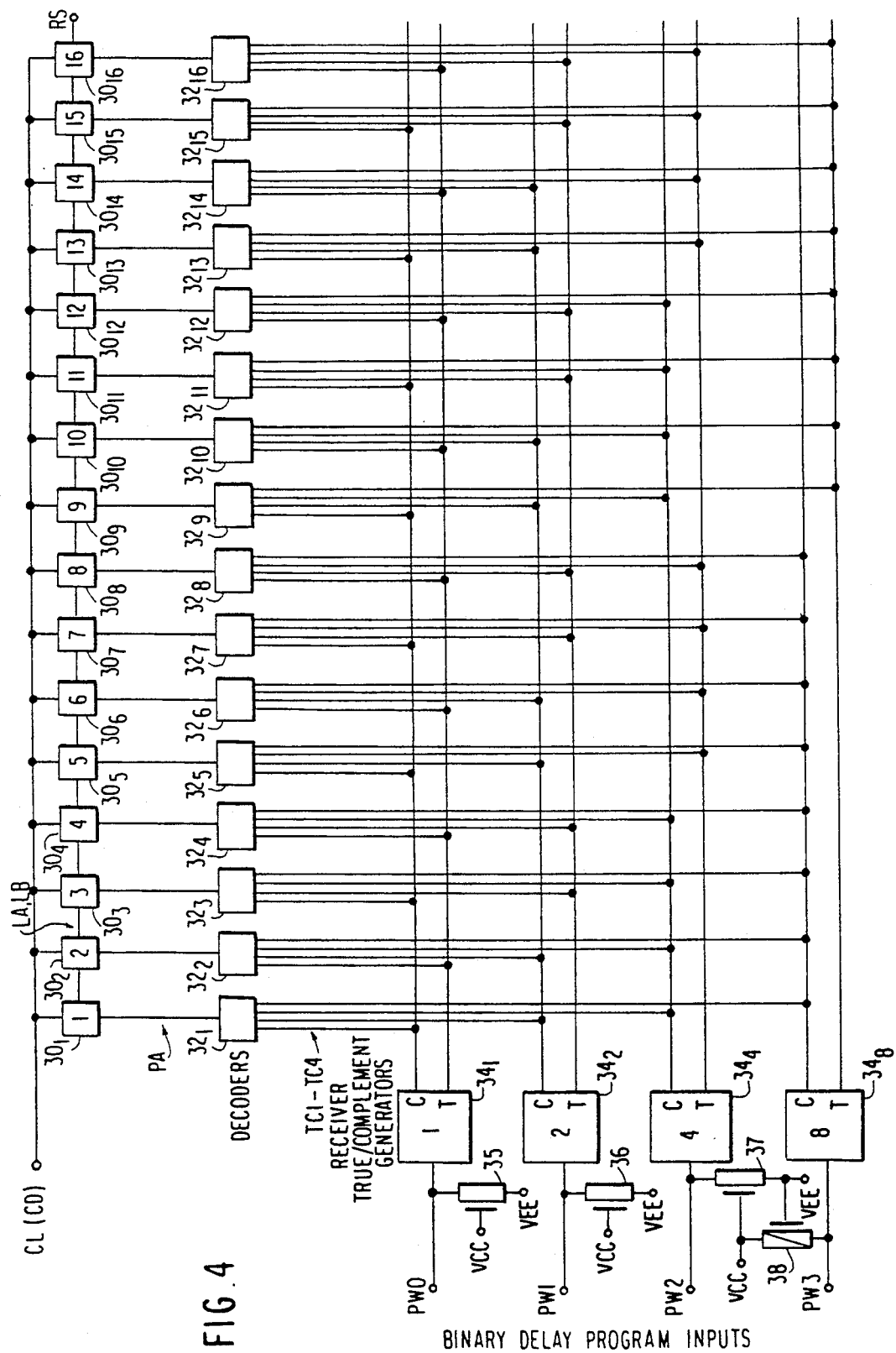
FIG. 4 is a block diagram showing in more detail the programmable delay line.

FIG. 4 shows in more detail the programmable delay line 26. The delay line itself is comprised of a plurality of stages $30_1$ to $30_{16}$, each connected to a common clock (CL) line and connected to an associated decoder $32_1$ to $32_{16}$. The binary delay program inputs, here denoted $PW_0$, $PW_1$, $PW_2$, and $PW_3$, are applied to four receivers $34_1$, $34_2$, $34_4$, and $34_8$, each of which provide true (T) and complement (C) outputs. These outputs are provided in sixteen different combinations of four each to the decoders $32_1$ to $32_{16}$.

The program receivers $34_1$, $34_2$, $34_4$, and $34_8$ are all FET circuits that receive d.c. levels and supply both true and complement outputs to the pulse width decoders. These receivers are pre-programmed with FET pullup and pulldown devices at appropriate inputs to supply a default code if no external input is applied. As shown in FIG. 4, the inputs to receivers $34_1$, $34_2$ and $34_4$ each have pull-down N-channel FETs 35, 36 and 37, respectively, while the input to receiver $34_8$ has a pull-up P-channel FET 38. The default code provided by these devices can be overridden by external inputs.

Figure 5:
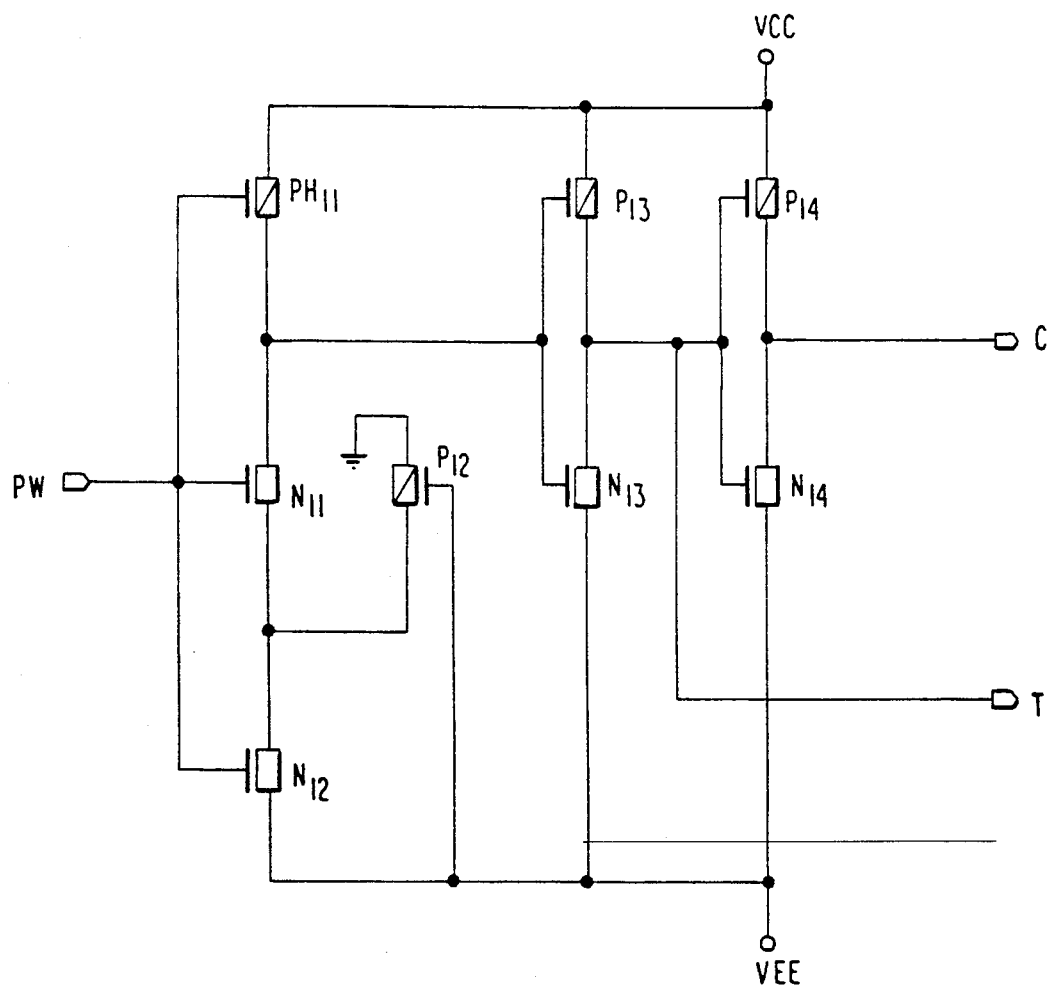
FIG. 5 is a schematic circuit diagram of one of the program receivers of the programmable delay line shown in FIG. 4.

As shown in FIG. 5, the receivers are each composed of three stages of FET inverters. The first stage inverter is constituted by a high threshold P-channel FET $PH_{11}$ and an N-channel FET $N_{11}$ connected in series. The program input, PW, is connected in common to the gates of the FETs $PH_{11}$ and $N_{11}$, and the source of FET $PH_{11}$ is connected to a positive supply voltage $V_{cc}$. However, the source of N-channel FET $N_1$ is connected to a negative supply voltage $V_{EE}$ via an N-channel FET $N_{12}$ having its gate connected to receive the program input PW. The source-drain junction of FETs $N_{11}$ and $N_{12}$ is connected to the drain of a P-channel FET $P_{12}$ having its source connected to circuit ground and its gate connected to the supply voltage $V_{EE}$. The combination of FETs $N_{12}/P_{12}$ makes the receiver more sensitive to input levels. FET $P_{12}$ appears as a resistor in the input circuit, while FET $N_{12}$ produces a negative feedback.

The second stage inverter is constituted by P-channel FET $P_{13}$ and N-channel FET $N_{13}$ connected in series, and the third stage inverter is constituted by P-channel FET $P_{14}$ and N-channel FET $N_{14}$ connected in series. The sources of FETs $P_{13}$ and $P_{14}$ are each connected to the supply voltage $V_{cc}$, while the sources of FETs $N_{13}$ and $N_{14}$ are each connected to the supply voltage $V_{EE}$. The gates of FETs $P_{13}/N_{13}$ are connected in common to the junction of the drains of FETs $PH_{11}/N_{11}$, and the gates of FETs $P_{14}/N_{14}$ are connected in common to the junction of the drains of FETs $P_{13}/N_{13}$. That same junction also provides the true (T) output of the receiver, and the junction of the drains of FETs $P_{14}/N_{14}$ provides the complement (C) output of the receiver.

Figure 6:
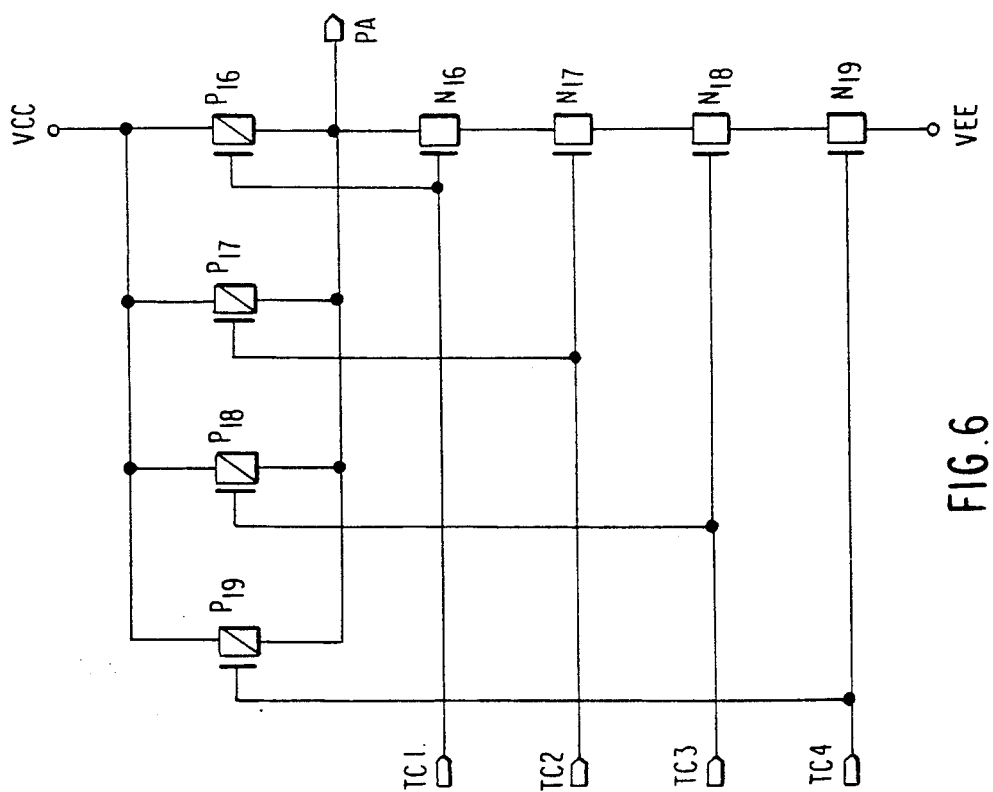
FIG. 6 is a schematic circuit diagram of one of the decoders of the programmable delay line shown in FIG. 4.

The pulse width decoders are four-way NAND gates that accept input form the program receivers and decode them into a sixteen line code to drive the programmable delay circuits. FIG. 6 shows the circuit of a typical one of the decoders. The NAND gate is of conventional design comprising four N-channel FETs $N_{16}$, $N_{17}$, $N_{18}$, and $N_{19}$ connected in series and four P-channel FETs $P_{16}$, $P_{17}$, $P_{18}$, and $P_{19}$ connected in parallel. The gates of FETs $N_{16}/P_{16}$, $N_{17}/P_{17}$, $N_{18}/P_{18}$, and $N_{19}/P_{19}$ are respectively connected to inputs $TC_1$, $TC_2$, $TC_3$, and $TC_4$, these inputs being connected to true or complement outputs of respective ones of the four receivers. The sources of the P-channel FETs $P_{16}$, $P_{17}$, $P_{18}$, and $P_{19}$ are connected in common to the supply voltage $V_{cc}$, while their drains are connected in common to the drain of N-channel FET $N_{16}$. The source of N-channel FET $N_{19}$ is connected to supply voltage $V_{EE}$. The junction of the drains of FETs $N_{16}/P_{16}$ is connected to the output terminal PA.

Figure 7:
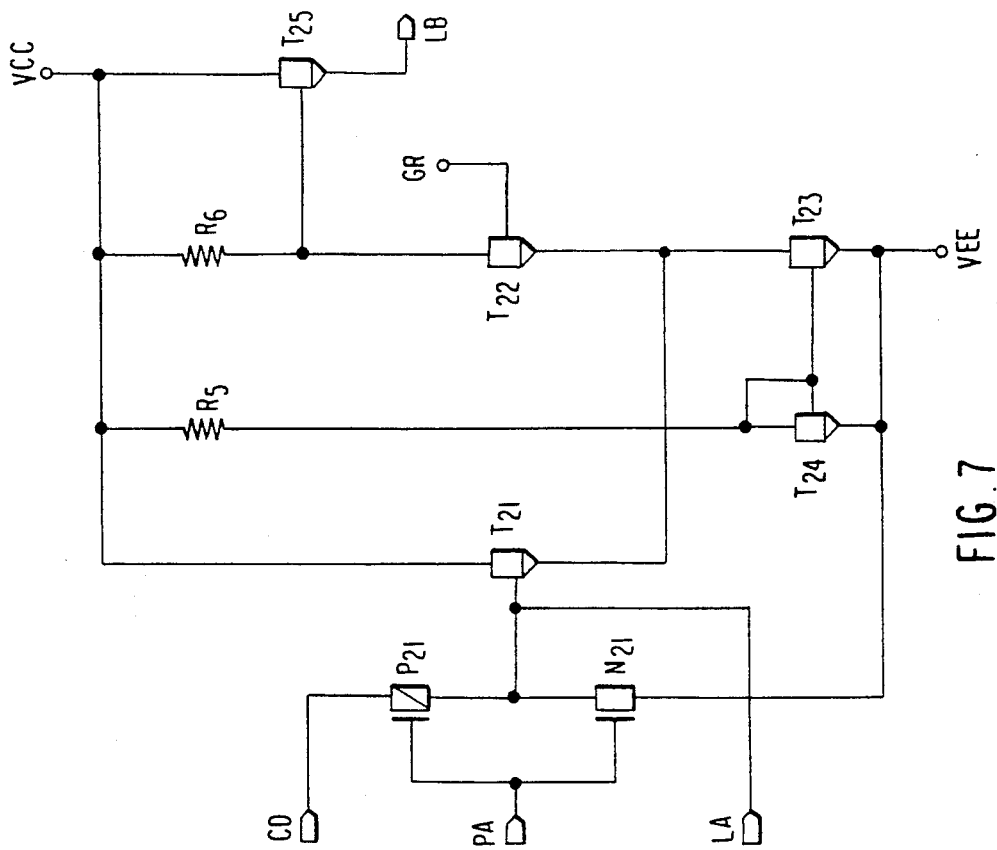
FIG. 7 is a schematic circuit diagram of a programmable delay unit which constitutes one stage of the programmable delay line shown in FIG. 4.

Each unit of the programmable delay line is a non-inverting ECL circuit having FET gates that steer either a trigger pulse or a pulse form another delay unit into the unit. The circuit is shown in FIG. 7. Each unit has three input terminals, denoted CL, PA and LA, and one output terminal, denoted LB. The CL terminal is the clock terminal which is connected in common to all units of the delay line. The PA terminal is the input from the decoder for that unit. The LA terminal is connected to the LB terminal from the preceding stage of the delay line.

NPN bipolar transistors $T_{21}$ and $T_{22}$ have their emitters connected in common to the collector of NPN bipolar transistor $T_{23}$. Diode-connected NPN bipolar transistor $T_{24}$ and resistor $R_5$ constitutes a current source, and transistor $T_{23}$ is a current mirror. The emitters of transistors $T_{23}$ and $T_{24}$ are connected in common to the source of voltage $V_{EE}$, while resistor $R_5$ is connected in series between the source of voltage $V_{cc}$ and the collector/base junction of transistor $T_{24}$. The collector of transistor $T_{21}$ is directly connected to the source of voltage $V_{cc}$. The collector of transistor $T_{22}$ is connected to voltage $V_{cc}$ via load resistor $R_6$, and the base of transistor $T_{22}$ is connected to circuit ground. The output from the collector of transistor $T_{22}$ is connected to the base of emitter follower NPN bipolar transistor $T_{25}$, the emitter of which is connected to output terminal LB.

The input steering FETs are constituted by P-channel FET $P_{21}$ and N-channel FET $N_{21}$ connected in series between the CL input terminal and voltage source $V_{EE}$. The PA input terminal is connected in common with the gates of the FETs $P_{21}/N_{21}$, and the drains of FETs $P_{21}/N_{21}$ are connected to the base of transistor $T_{21}$.

The ECL devices $T_{21}$, $T_{22}$ and $R_5$, with current generator $R_6$, $T_{24}$ and mirror $T_{23}$, form a bipolar non-inverting circuit. A trigger pulse is fed in common to the clock (CL) terminals of all the delay units in the delay line; however, the trigger pulse is gated through to only one unit when its P-channel FET $P_{21}$ is turned on by a down level at terminal PA from its decoder circuit. A down level at terminal PA also turns off N-channel FET $N_{21}$ and allows the trigger pulse to take control of terminal LA. The emitter followers, $T_{25}$, of all preceding units are off since their PA inputs are up and no LA input is present at the first unit.

While the invention has been described in terms of a single preferred embodiment, those skilled in the art will recognize that the invention can be practiced with modification within the spirit and scope of the appended claims. For example, while the preferred embodiment uses a delay line composed of sixteen stages, any number of stages can be used depending on specific requirements.

Having thus described my invention, what I claim as new and desire to secure by Letters Patent is as follows:

1. An on-chip clock chopper/stretcher circuit for supplying clock pulses to on-chip circuits requiring clocking, said circuit comprising:

receiver means for receiving and chopping an off-chip generated system clock signal;

latch means coupled to an output of said receiver means, said latch means being set by said receiver means on a transition of said system clock signal and providing a latched output signal to said receiver means;

clock driver means coupled to said output of said receiver means, said clock driver means driving said on-chip circuits, said receiver in combination with said clock driver means introducing only one stage delay in a clock path to said on-chip circuits;

delay line means connected to an output of said clock driver means for generating an output signal defining a predetermined clock width; and reset means responsive to output signal of said delay line means for resetting said latch means.

2. The on-chip clock chopper/stretcher circuit recited in claim 1 wherein said receiver means comprise:

an emitter coupled logic bipolar transistor receiver circuit having an input connected to receive said off-chip generated system clock signal and an output connected to a first node, an input to said latch means being connected to said first node and an output from said latch means being connected to a second node;

an emitter coupled logic bipolar delay circuit having input connected to receive said off-chip generated system clock signal and generating a delayed output; and an OR gate having first and second inputs and an output, said first input being connected to said second node, said second input being connected to receive said delayed output of said delay circuit and said output being connected to said receiver circuit to disable said receiver circuit.

3. The on-chip clock chopper/stretcher circuit recited in claim 2 wherein said off-chip generated system clock signal is a differential signal and the input of said receiver circuit is a differential input.

4. The on-chip clock chopper/stretcher circuit recited in claim 1 wherein said delay line means is a programmable delay line.

5. The on-chip clock chopper/stretcher circuit recited in claim 4 wherein said programmable delay line comprises:

a plurality of delay circuit stages connected in cascade, each stage connected to receive a trigger pulse, a first one of said stages being connected to the output of said clock driver means;

a plurality of decoder circuits, one for each of said delay circuit stages, each decoder circuit being connected to a corresponding one of said delay circuit stages to control an input to the delay circuit stage; and code receiver means connected to receive a code defining said predetermined clock width, said code receiver means being connected to each of said decoder circuits so that only one of said decoder circuits provides an output for any given code.

6. The on-chip clock chopper/stretcher circuit recited in claim 5 wherein said programmable delay line further comprises mans connected to said code receiver means for providing a default code input in the absence of a code defining said predetermined clock width.

7. The on-chip clock chopper/stretcher circuit recited in claim 5 wherein said code is a binary code and said code receiver means comprises a plurality of code receiver circuits connected to receive said binary code and providing true and complement outputs, said decoders being connected to different exclusive combinations of said true and complement outputs of said plurality of code receiver circuits.

* * * * *